United States Patent
Ker et al.

(10) Patent No.: US 6,806,160 B2
(45) Date of Patent: Oct. 19, 2004

(54) METHOD FOR FORMING A LATERAL SCR DEVICE FOR ON-CHIP ESD PROTECTION IN SHALLOW-TRENCH-ISOLATION CMOS PROCESS

(75) Inventors: Ming-Dou Ker, Hsin-Chu (TW); Chyh-Yih Chang, Taipei (TW); Tien-Hao Tang, Hsin-Chu (TW)

(73) Assignee: United Microelectronics Corp. (TW)

( * ) Notice: Subject to any disclaimer, the term of this patent is extended or adjusted under 35 U.S.C. 154(b) by 37 days.

(21) Appl. No.: 10/178,392

(22) Filed: Jun. 25, 2002

(65) Prior Publication Data

US 2002/0163009 A1 Nov. 7, 2002

Related U.S. Application Data

(62) Division of application No. 09/779,476, filed on Feb. 9, 2001, now Pat. No. 6,498,357.

(51) Int. Cl.[7] .......................................... H01L 21/331
(52) U.S. Cl. ....................... 438/371; 438/223; 438/224; 438/227; 438/228; 438/309
(58) Field of Search ................. 257/173, 341, 257/355, 356, 357, 358, 359, 360, 361, 362, 363, 371; 438/133, 202, 205, 223, 224, 227, 228, 234, 309, 585, 587

(56) References Cited

U.S. PATENT DOCUMENTS

| | | | |
|---|---|---|---|
| 4,939,616 A | 7/1990 | Rountree | |
| 5,012,317 A | 4/1991 | Rountre | |
| 5,225,702 A | 7/1993 | Chatterjee | |
| 5,281,842 A | * 1/1994 | Yasuda et al. | 257/371 |
| 5,465,189 A | 11/1995 | Polgreen et al. | |
| 5,602,404 A | * 2/1997 | Chen et al. | 257/112 |
| 5,622,885 A | * 4/1997 | Merrill et al. | 438/220 |
| 5,719,733 A | * 2/1998 | Wei et al. | 257/356 |
| 5,754,381 A | 5/1998 | Ker | |
| 5,856,214 A | * 1/1999 | Yu | 438/133 |
| 5,903,420 A | * 5/1999 | Ham | 257/355 |
| 6,081,002 A | 6/2000 | Amerasekera et al. | |
| 6,172,403 B1 | * 1/2001 | Chen | 257/356 |
| 6,184,557 B1 | * 2/2001 | Poplevine et al. | 257/358 |
| 6,207,998 B1 | * 3/2001 | Kawasaki et al. | 257/371 |
| 6,228,704 B1 | * 5/2001 | Uchida | 438/241 |
| 6,423,589 B2 | * 7/2002 | Park et al. | 438/231 |
| 6,465,848 B2 | * 10/2002 | Ker et al. | 257/355 |
| 6,482,692 B2 | * 11/2002 | Kawasaki et al. | 438/218 |

* cited by examiner

Primary Examiner—Steven Loke
Assistant Examiner—Quang Vu

(57) ABSTRACT

A method for forming a lateral SCR device for on-chip ESD protection in shallow-trench-isolation CMOS process is provided. In the present lateral SCR device, the shallow trench isolation among the current conduction path of the lateral SCR device is removed and instead of a dummy gate. Thereby, the SCR device has a narrower anode-to-cathode spacing, and then the lateral SCR device can be turned on more quickly to protect the CMOS IC's in ESD events. Additionally, the silicon area of the substrate occupied by the lateral SCR device is also saved. This method for forming a lateral SCR device without shallow-trench-isolation regions in its current path can be fully process-compatible to general CMOS technologies by only changing layout patterns in the mask layers.

36 Claims, 15 Drawing Sheets

METHOD FOR FORMING A LATERAL SCR DEVICE FOR ON-CHIP ESD PROTECTION IN SHALLOW-TRENCH-ISOLATION CMOS PROCESS

This is a Divisional, application under 37 CF 1.53(b) of prior application Ser. No. 09/779,476, filed on Feb. 9, 2001, now U.S Pat. No. 6,498,357 entitled METHOD FOR FORMING A LATERAL SCR DEVICE FOR ON-CHIP ESD PROTECTION IN SHALLOW-TRENCH-ISOLATION CMOS PROCESS, by the following named inventor(s): Ming-Dou KER; Chyh-Yih CHANG and Tien-Hao TANG.

BACKGROUND OF THE INVENTION

1. Field of the Invention

The present invention relates to an ESD (electrostatic discharge) protection device, and more particularly to a SCR (Silicon Controlled Rectifier) device for on-chip ESD protection in shallow-trench-isolation CMOS process.

2. Description of the Prior Art

SCR (Silicon Controlled Rectifier) has been commonly used for on-chip ESD protection. The important feature of SCR is the holding characteristic thereof. In the holding region, the SCR can sustain much high current and clamp the voltage across itself at a very low voltage level. Therefore, the SCR's are very useful to bypass high current events such as electrostatic discharge (ESD). However, the shallow trench isolation (STI) region in a 0.18 $\mu$m CMOS process often has a depth about 0.4~0.5 $\mu$m from the silicon surface, but the $N^+$ or $P^+$ diffusions often have a junction depth of only 0.15~0.18 $\mu$m. Therefore, the deeper STI region in the SCR device will limit the current flowing path, e.g. make a longer current flowing path, in the device structure, and causes the SCR device to have a longer turn-on time, and become un-efficient for on-chip ESD protection. The human-body-model (HBM) ESD events have a rise time of 5~10 ns, a slow turn-on SCR can not be turned on in time to bypass the ESD event, before the internal devices which are protected by the SCR device are damaged by ESD.

The SCR devices for ESD protection are developed about ten years. The prior SCR devices for ESD protection are shown in FIG. 1 to FIG. 6 and will be described as follows, wherein the prior SCR devices of FIG. 1 to FIG. 4 and FIG. 6 were developed by Texas Instruments Corporation, and FIG. 5 was developed by Industrial Technology Research Institute (ITRI):

In FIG. 1, the lateral SCR structure was disclosed in a US patent of U.S. Pat. No. 5,012,317. The main SCR path is P+(48), N(46), P(44) and N+(52) which form the PNPN structure. When an ESD event is happened on the pad 12 related to ground, the lateral SCR will be triggered on and into the snapback region. In the snapback region, the SCR will hold the voltage across itself at a low voltage level and sustain a high current. Thus, the ESD current can be discharged effectively through this SCR device.

In FIG. 2, the lateral SCR structure was disclosed in a US patent of U.S. Pat. No. 4,939,616. Comparing with the lateral SCR structure of FIG. 1, there is a highly doped region 42 added into the interface of the N well 32 and P substrate 30, and the structure of FIG. 2 is called modified lateral SCR (MLSCR). The interface breakdown voltage of N+42/P substrate 30 is lower than that of the N well 32/P substrate 30, so that the trigger-on voltage of the MLSCR is lower than that of LSCR of FIG. 1. Therefore, the MLSCR can trigger-on faster in ESD events.

In FIG. 3, the lateral SCR structure was disclosed in a US patent of U.S. Pat. No. 5,465,189. The lateral SCR structure of FIG. 3 differs from the MLSCR of FIG. 2 in adding a polysilicon gate 39 between the highly doped regions $N_3+$ and $N_2+$. The polysilicon gate 39 with highly doped regions $N_3+$ and $N_2+$ form an NMOS device. Thus, the distance between the isolated highly doped regions $N_3+$ and $N_2+$ could be shrunk, and the trigger-on voltage of the SCR structure could further lower down. This structure of FIG. 3 is called low voltage trigger SCR (LVTSCR).

In FIG. 4, the lateral SCR structure was disclosed in a US patent of U.S. Pat. No. 5,225,702. The polysilicon electrode 237 instead of the field oxide is used to define the distance between the N+ region 226 and N well 236. Changing this distance could modulate the holding voltage of the SCR. Because the polysilicon electrode could be defined in a smallest area in any generation CMOS process, this SCR has higher design flexibility.

In FIG. 5, the lateral SCR structure was disclosed in a US patent of U.S. Pat. No. 5,754,381, which proposed a high-triggered current technology. On the right part of FIG. 5 is the modified NTLSCR (NMOS-trigger LSCR) structure and the left part of FIG. 5 is an NMOS. When an ESD zaps on the output pad, referring to the right portion of this figure, the N+ region of Dp2 could guide some current into VDD line and sink the current to raise the trigger current of the modified NTLSCR. This design could prevent the SCR from being triggered on by the system transient noise to avoid latch-up phenomenon when IC is in the normal operation condition.

In FIG. 6, the lateral SCR structure was disclosed in a US patent of U.S. Pat. No. 6,081,002. The structure of FIG. 6 is comprised of an NMOS and a PMOS, and the drain side 122 of the NMOS and the source side 134 of the PMOS are connected by silicide 136. The location of the drain of the NMOS is on the interface of the N well 104 and P substrate 102. The main highly doped regions of this lateral SCR structure are all defined by polysilicon gates.

The present invention proposes a lateral SCR device without shallow trench isolation on the conduction current flowing path, so that the drawback of the current flowing path is limited by the shallow trench isolation in prior lateral SCR device is overcome.

SUMMARY OF THE INVENTION

It is one object of the present invention to provide a method for forming a lateral SCR device for on-chip ESD protection in shallow-trench-isolation CMOS process, in which one shallow trench isolation on the conduction current flowing path of the SCR device is removed and instead of a dummy gate, and thus a narrower anode-to-cathode spacing is obtained, so that the SCR device provides a quicker turn-on speed to discharge the ESD current.

It is another object of the present invention to provide a method for forming a lateral SCR device for on-chip ESD protection in shallow-trench-isolation CMOS process, wherein there is no shallow trench isolation in the conduction current flowing path of the SCR device, so that the SCR device has a narrower anode-to-cathode spacing to save silicon area of the substrate occupied by the SCR device.

It is a further object of the present invention to provide a lateral SCR device for on-chip ESD protection in shallow-trench-isolation CMOS process, which can be realized by only changing layout pattern in the mask layers, and fully process-compatible to general CMOS technologies.

In order to achieve the above objects, the present invention provides a method for forming a lateral SCR device for on-chip ESD protection in shallow-trench-isolation CMOS process. Firstly, providing a semiconductor substrate with a first conductive type and forming a plurality of shallow trench isolations in the substrate. Then, forming a first well with a second conductive type between one pair of the shallow trench isolations in the substrate. Afterward, forming a dummy gate above the first well on the substrate. Subsequently, forming a MOS-like gate with the second conductive type on the substrate beside the first well. Then, forming a first highly doped diffusion region with the second conductive type beside each side of the MOS-like gate in the substrate, one first diffusion region across one portion of the first well and one portion of the substrate and adjacent to one side of the dummy gate, while the other first diffusion region with opposite to the first diffusion region across the first well and the substrate and connected to a cathode terminal. Finally, forming a second highly doped diffusion region with the first conductive type beside the dummy gate with opposite to the first diffusion region adjacent to the dummy gate, the second diffusion region connected to an anode terminal.

BRIEF DESCRIPTION OF THE DRAWINGS

The foregoing aspects and many of attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

Figure 7A:
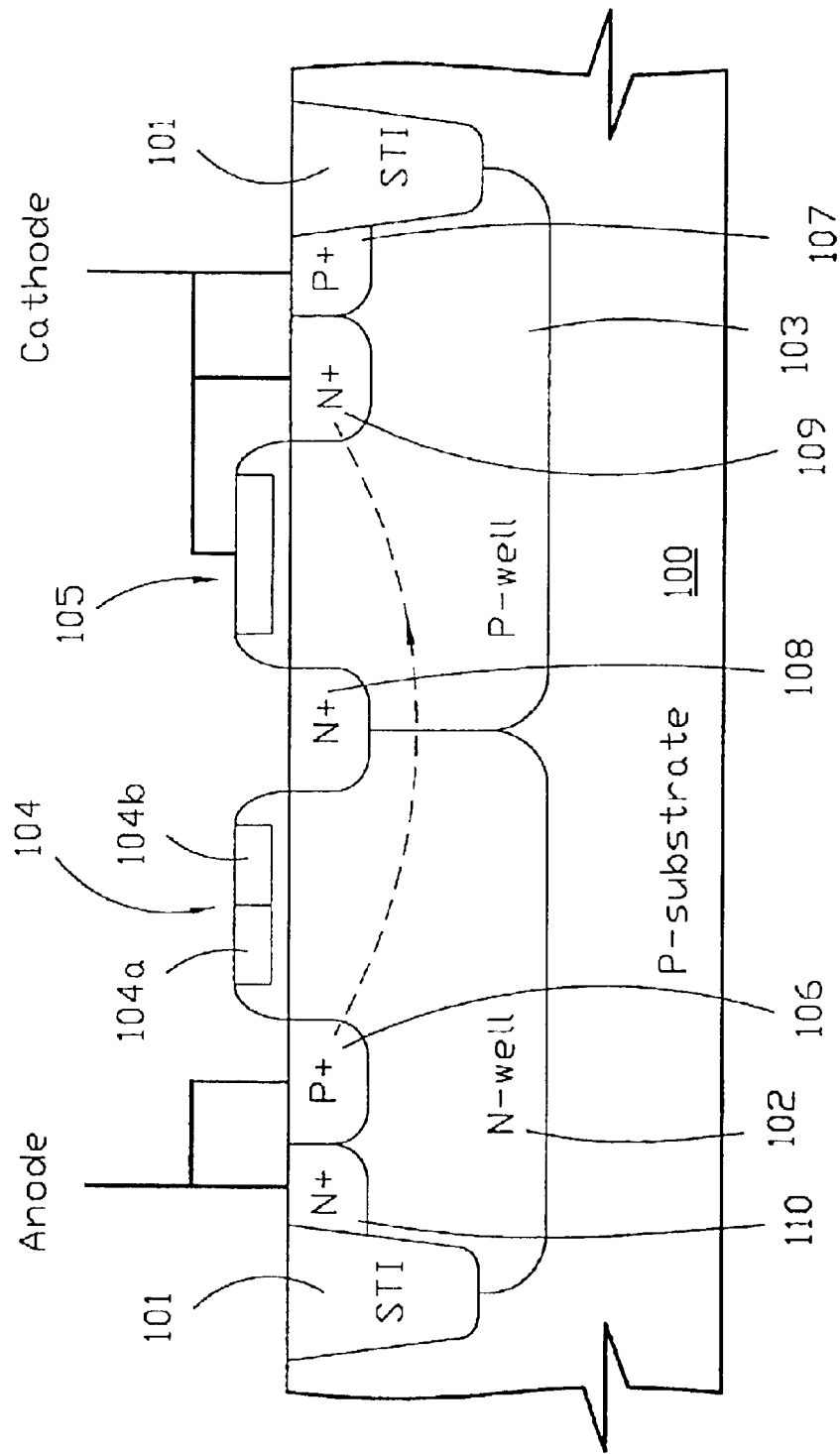
FIG. 7A depicts a cross-sectional view of an NMOS-trigger lateral SCR device according to the present invention.
Figure 8A:
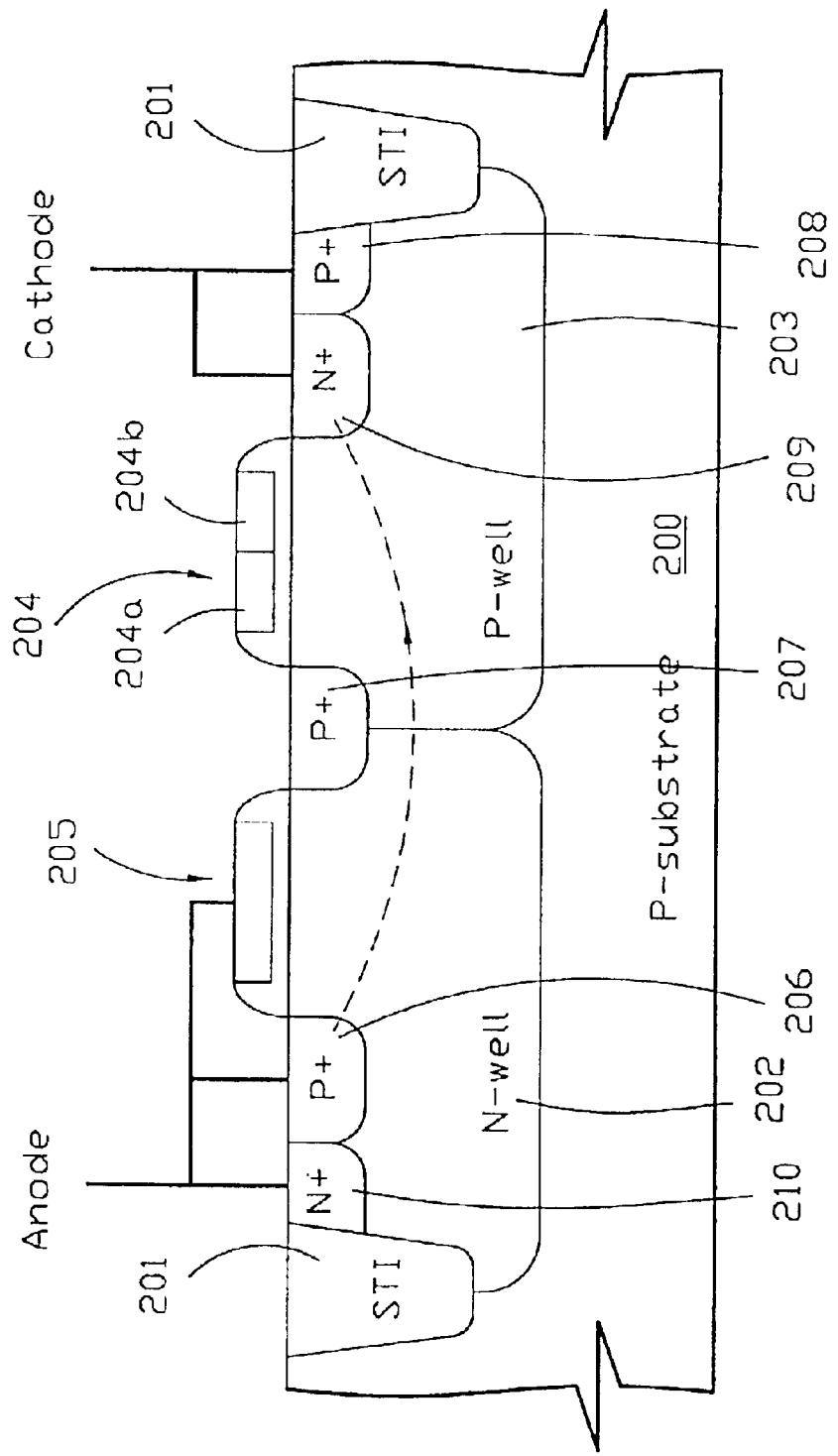
FIG. 8A depicts a cross-sectional view of a PMOS-trigger lateral SCR device according to the present invention.

In the present invention, a new effective LSCR structure is provided. FIG. 7A and FIG. 8A illustrate the cross-sectional view of the provided LSCR structure called STI-blocking NTLSCR (NMOS-trigger lateral silicon controlled rectifier) and STI-blocking PTLSCR (PMOS-trigger lateral silicon controlled rectifier) respectively. These structures can improve the current path in the SCR device structure. Without the shallow-trench-isolation region in its current path, the SCR can be triggered on more quickly to discharge ESD current. Therefore, it can provide better ESD protection for the IC product.

FIG. 7A shows an NMOS-trigger LSCR device of a first preferred embodiment of the present invention. The method of the first preferred embodiment comprises firstly providing a P substrate 100, and forming a plurality of shallow trench isolations 101 in the substrate 100. Then, forming a N well 102 and a P well 103 adjacent thereto between one pair of the shallow trench isolations 101 in the substrate 100. The N well 102 and P well 103 can be formed by the conventional ion implantation method, using a dosage of the dopant about $10^{12}$ to $10^{13}/cm^2$. Next, forming a dummy gate 104 and an N type MOS-like polysiliccon gate 105, respectively on the N well 102 and P well 103. The dummy gate 104 comprises a P type gate electrode 104a and an N type gate electrode 104b, both of which can be formed by the known dopant implantation. The MOS-like polysilicon gate 105 is connected to a cathode terminal. Thereafter, simultaneously forming a first highly doped P+ diffusion region 106 beside one side of the dummy gate 104 in the N well 102 and a second highly doped P+ diffusion region 107 between the MOS-like polysilicon gate 105 and one shallow trench isolation 101 in the P well 103. The first P+ diffusion region 106 is connected to an anode terminal and the second P+ diffusion region 107 is connected to the cathode. Both of which can be formed by known dopant implantation using a dosage of dopant about $10^{15}/cm^2$, which is the same as the method for forming a MOS source/drain region. Finally, simultaneously forming a third highly doped N+ diffusion region 108 on the interface of the N well 102 and the P well 103 and between the dummy gate 104 and the MOS-like polysilicon gate 105, a fourth highly doped N+ diffusion region 109 beside one side of the MOS-like polysilicon gate 105 with opposite to the third N+ diffusion region 108 and a fifth highly doped N+ diffusion region 110 between one shallow trench isolation 101 and the first P+ diffusion region 106. The fourth N+ diffusion region 109 is connected to the cathode and the fifth N+ diffusion region 110 is connected to the anode. These three highly doped diffusion regions 108, 109 and 110 can be formed by way of the known dopant implantation with a dosage of dopant about $10^{15}/cm^2$, which is the same with the method for forming a MOS source/drain region. Therefore, the first P+ diffusion region 106, N well 102, P-well 103 and the fourth N+ diffusion region 109 form the PNPN structure of the NTLSCR device.

Figure 7B:
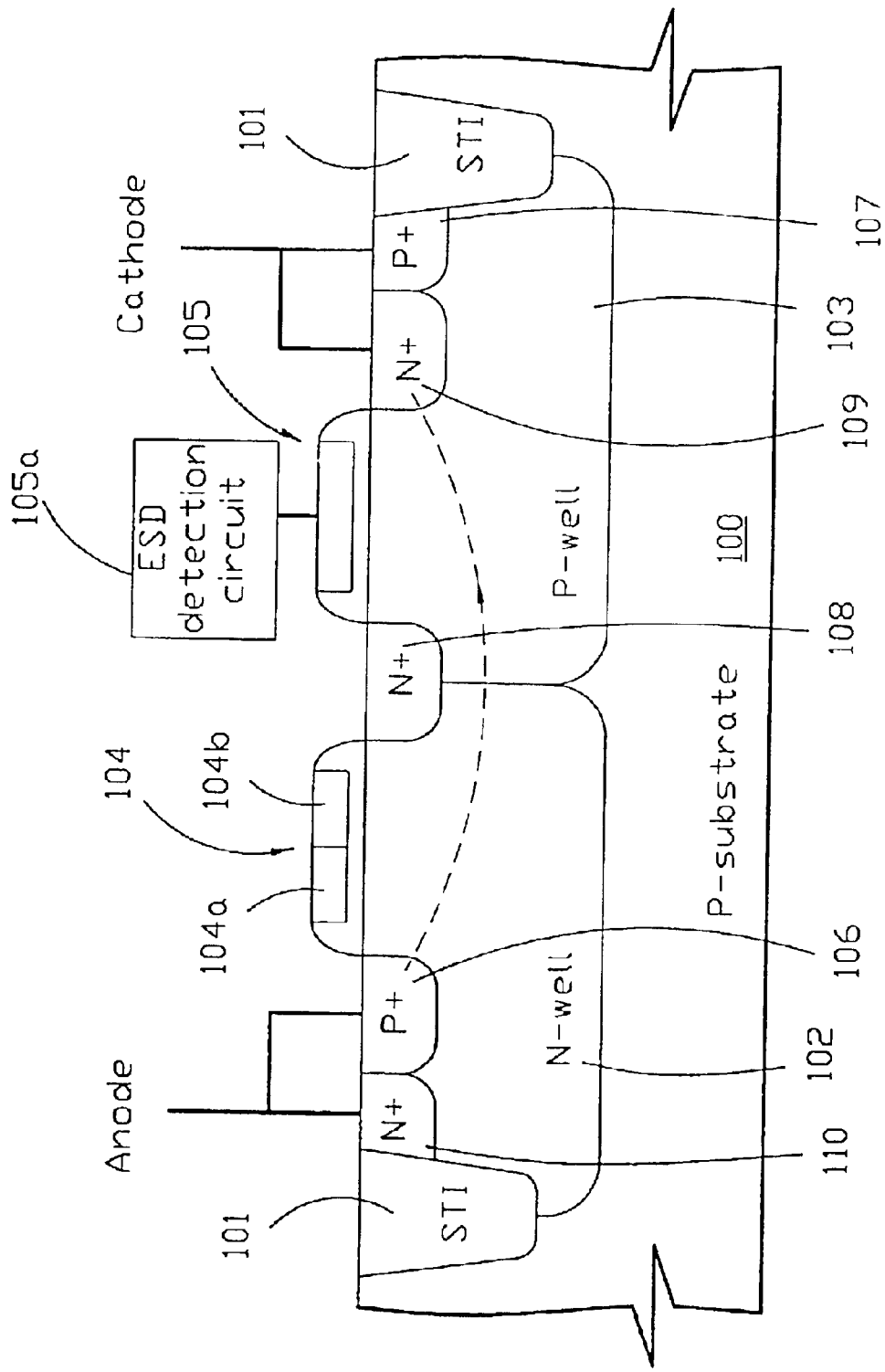
FIG. 7B depicts a cross-sectional view of an alternative of the NMOS-trigger lateral SCR device of FIG. 7A.

FIG. 7B shows an alternative of the the NMOS-trigger LSCR of FIG. 7A, in which the MOS-like polysilicon gate 105 is not connected to the cathode, but connected to an ESD detection circuit 105a. During ESD zapping, the ESD detection circuit 105a can detect the ESD event and generate a positive bias voltage Vg to turn on the gate 105. Therefore, the NMOS-trigger SCR device can be directly turned on more quickly by the Vg voltage. When the NMOS transistor is turned on by the gate voltage Vg, the SCR device will be triggered on.

Figure 1:
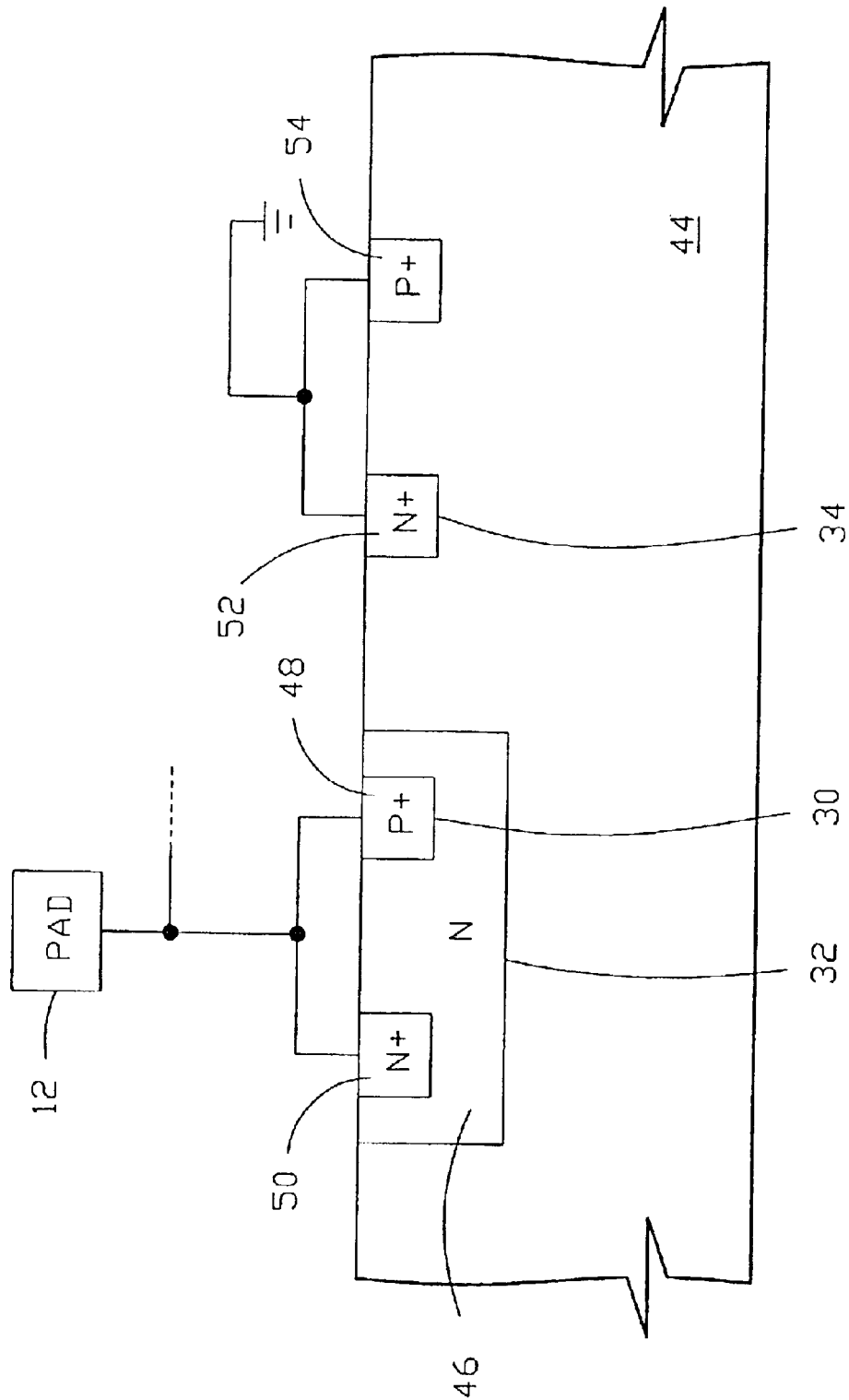
FIG. 1 depicts a cross-sectional view of a prior lateral SCR device disclosed in U.S. Pat. No. 5,012,317.
Figure 2:
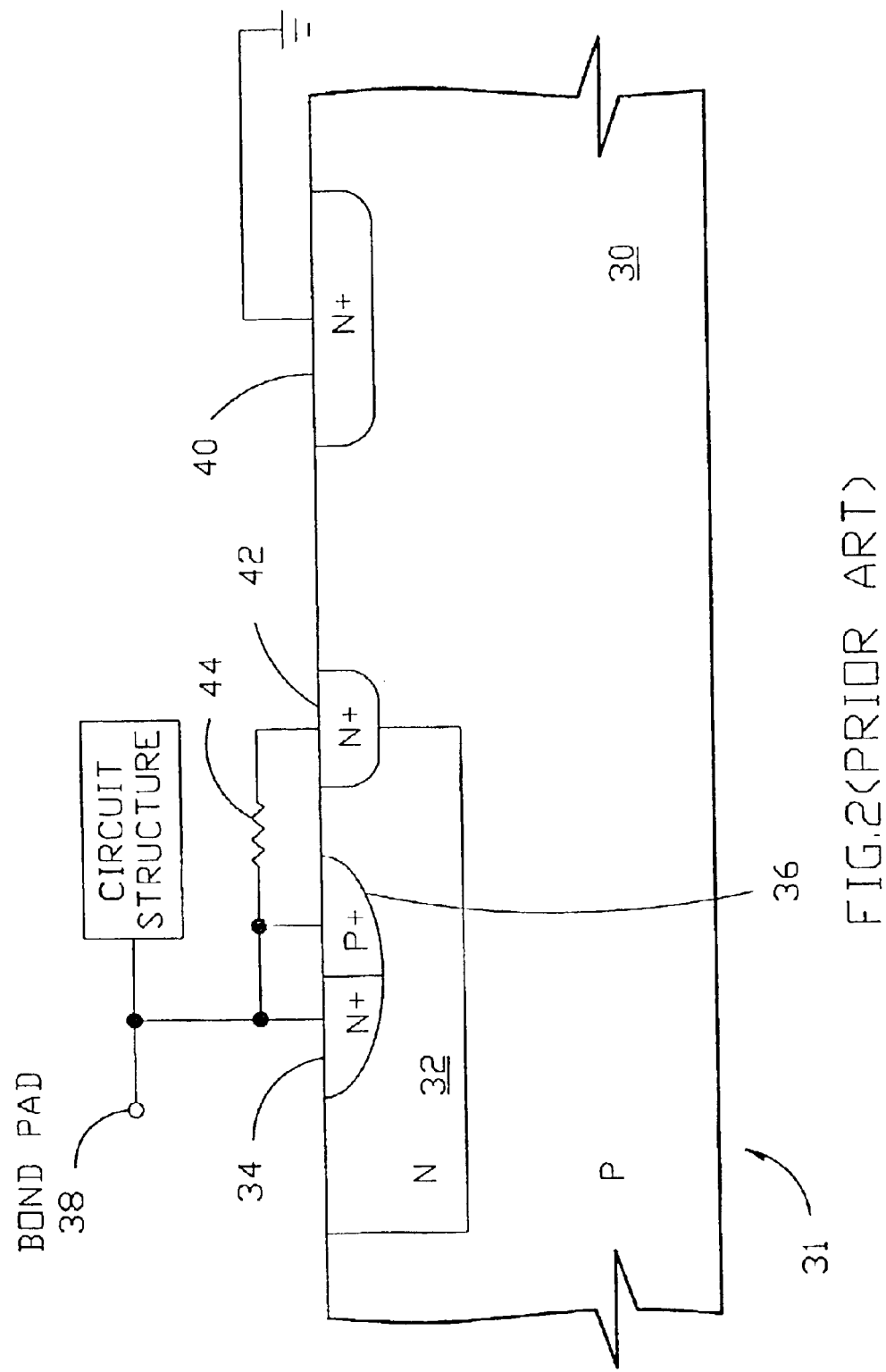
FIG. 2 depicts a cross-sectional view of a prior modified lateral SCR device disclosed in U.S. Pat. No. 4,939,616.
Figure 3:
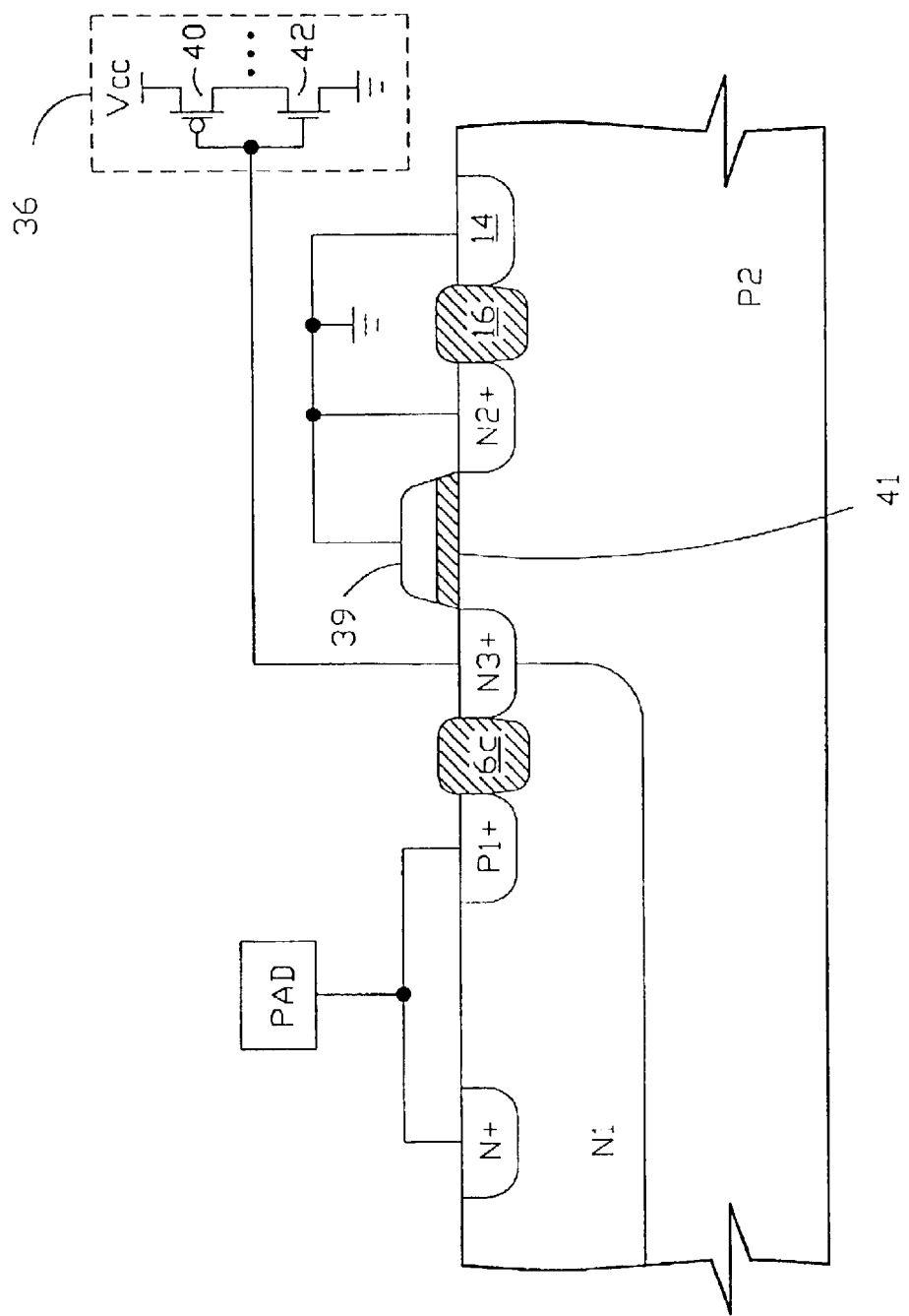
FIG. 3 depicts a cross-sectional view of a prior low voltage trigger SCR device disclosed in U.S. Pat. No. 5,465,189.
Figure 4:
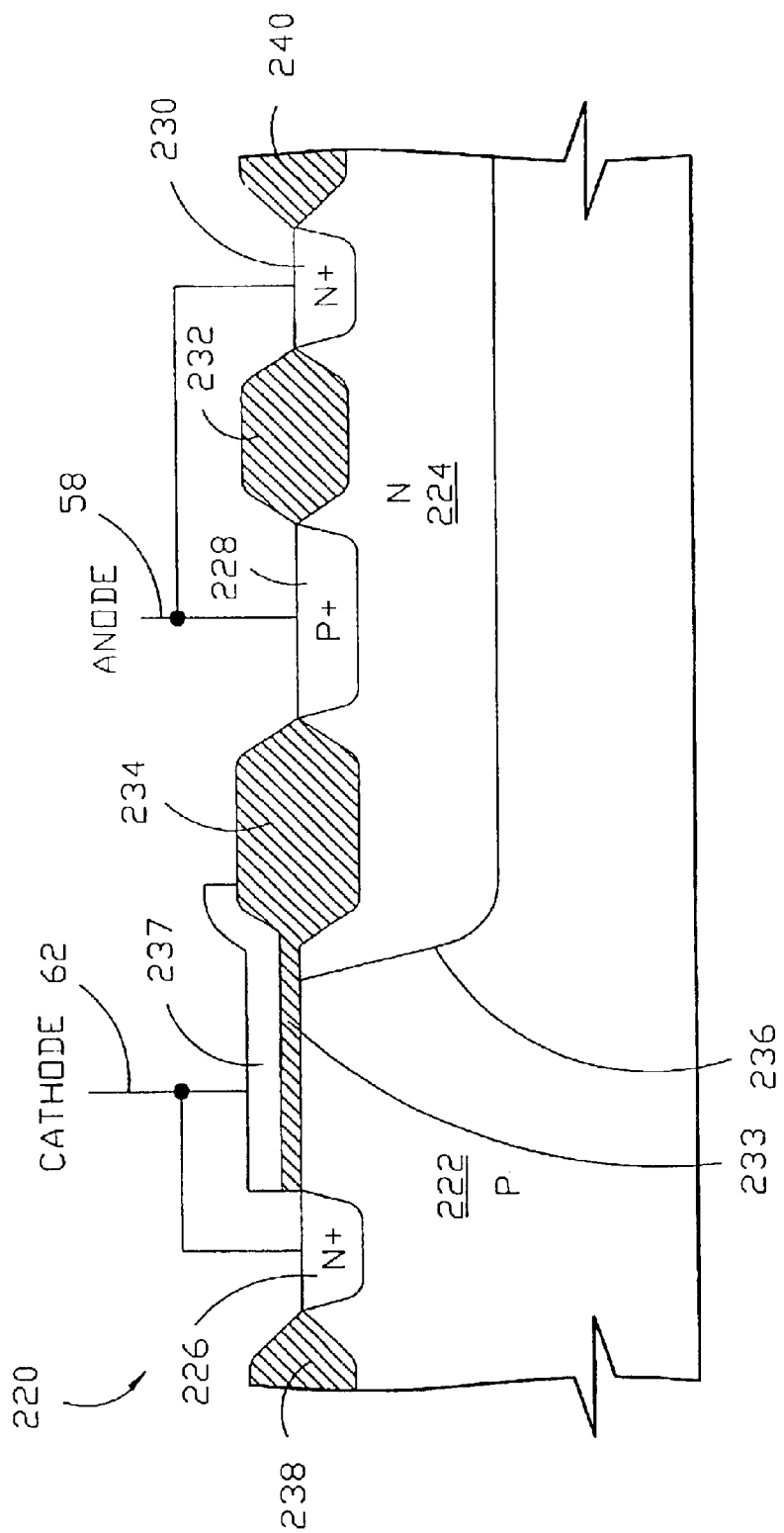
FIG. 4 depicts a cross-sectional view of another prior lateral SCR device disclosed in U.S. Pat. No. 5,225,702.
Figure 5:
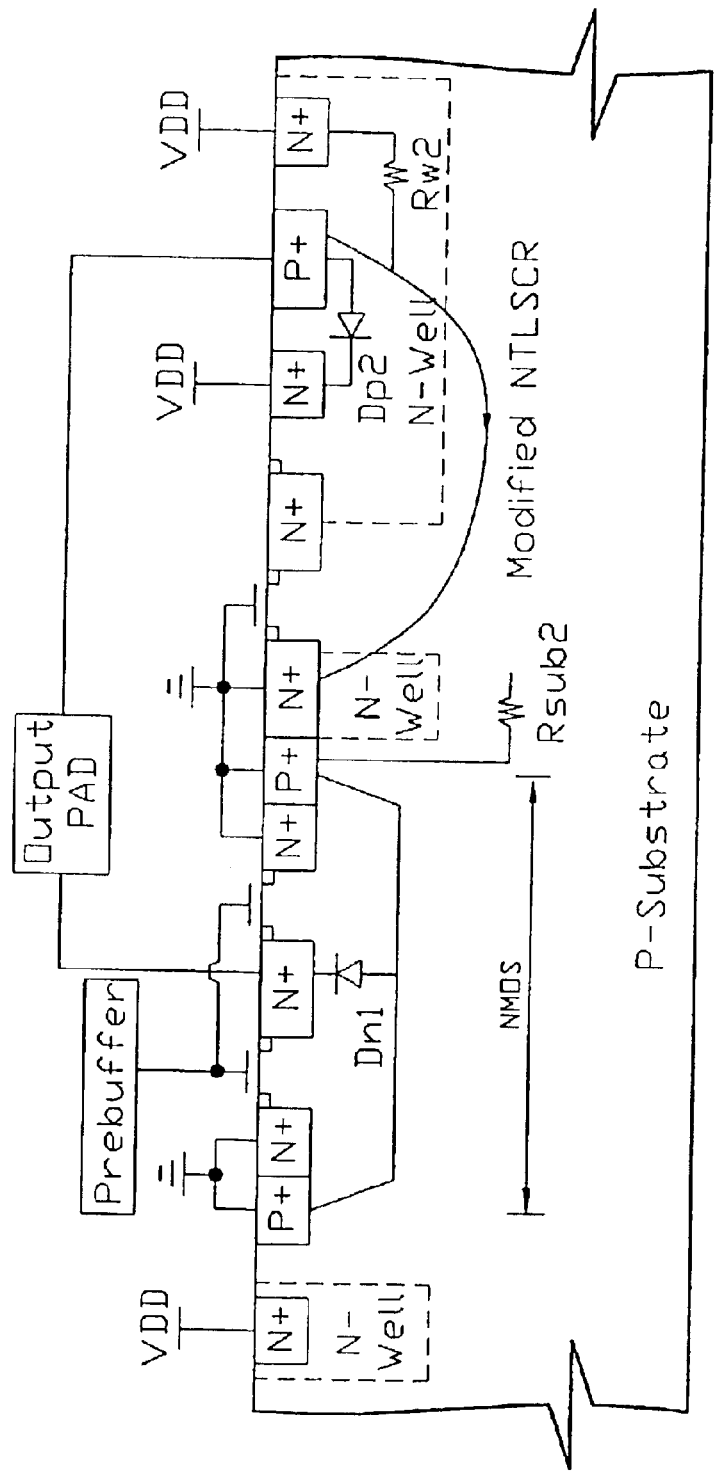
FIG. 5 depicts a cross-sectional view of a prior high-current NMOS-trigger lateral SCR device disclosed in U.S. Pat. No. 5,754,381.
Figure 6:
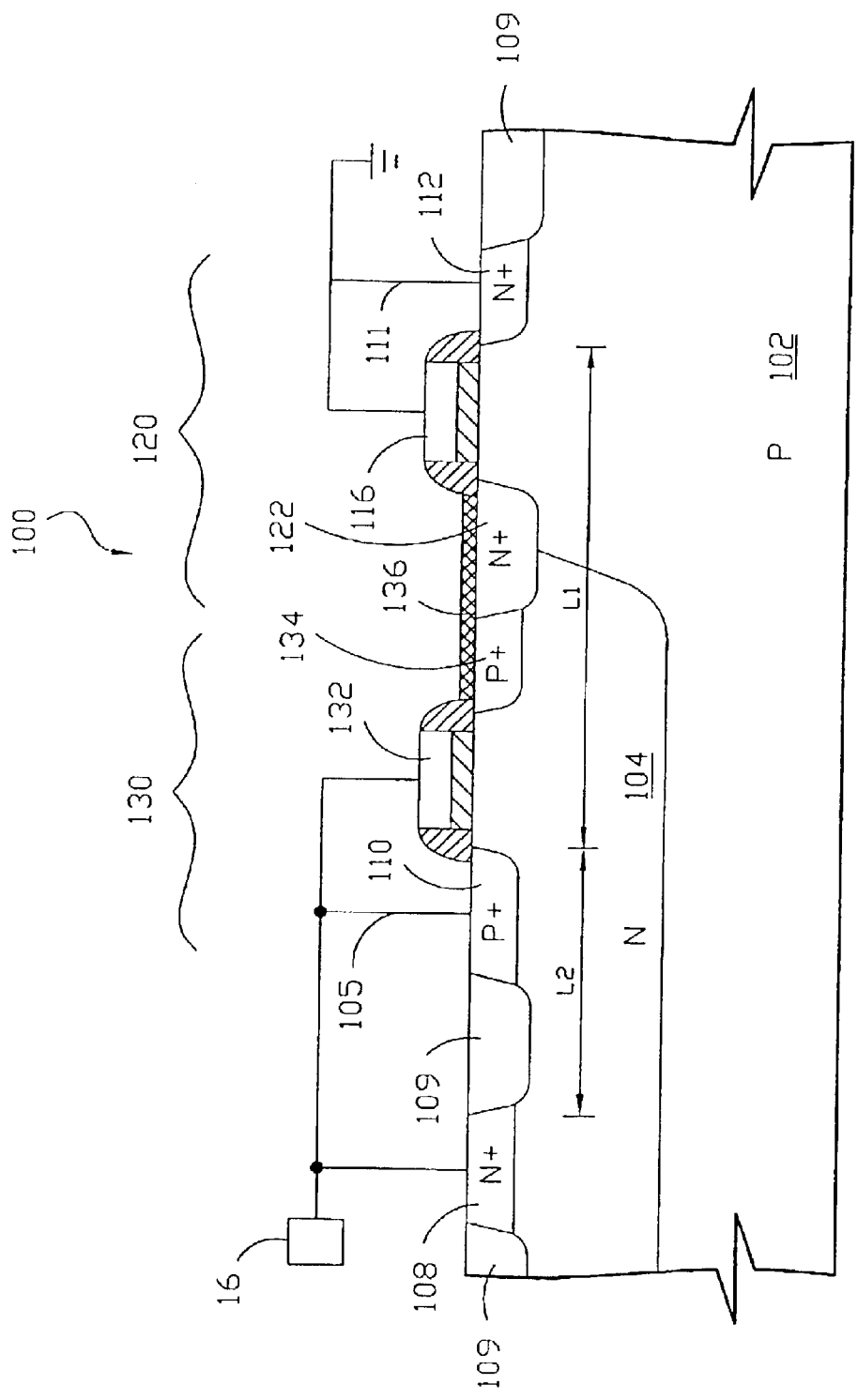
FIG. 6 depicts a cross-sectional view of a further another prior lateral SCR device disclosed in U.S. Pat. No. 6,081,002.
Figure 9:
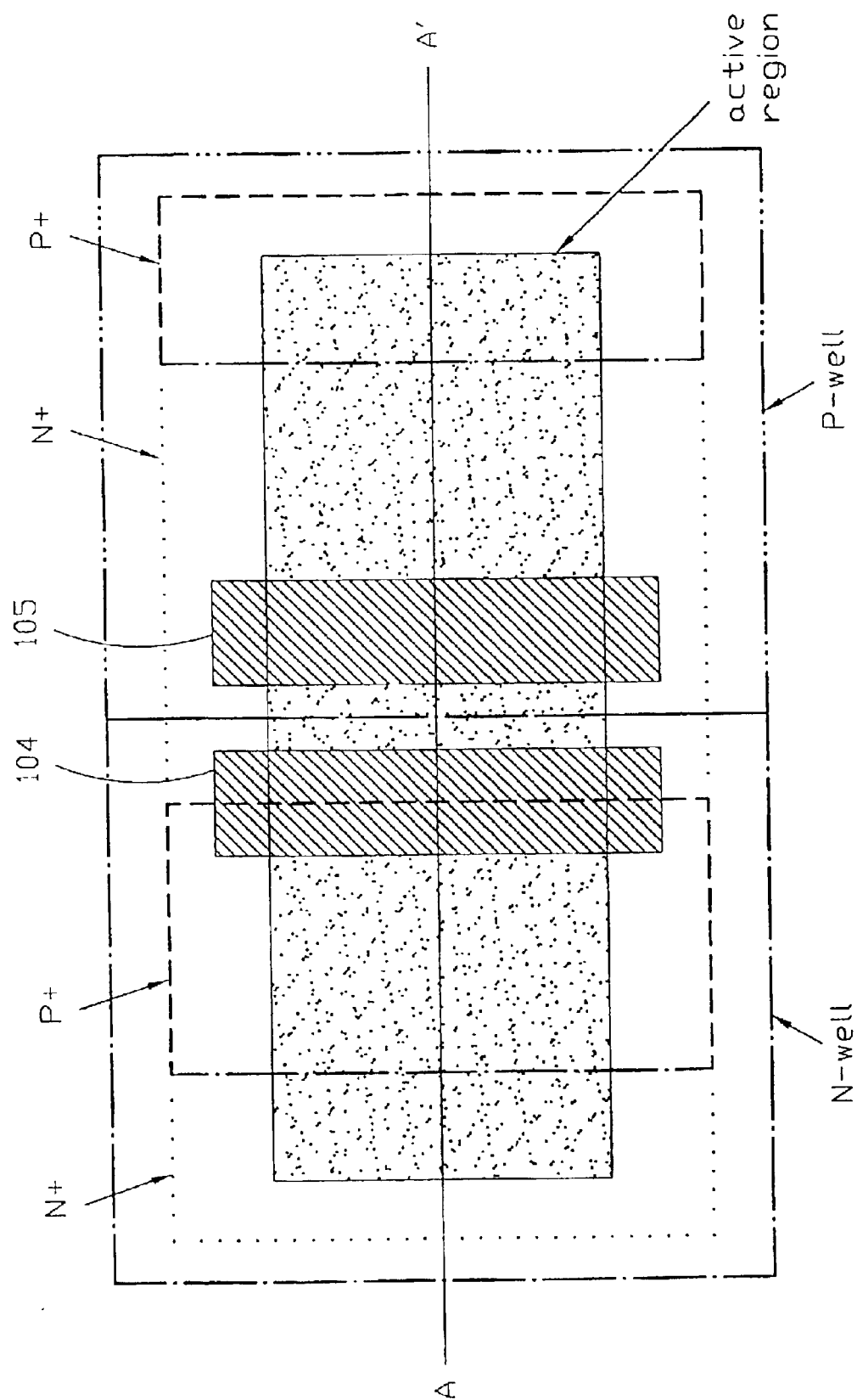
FIG. 9 depicts a top view of the NMOS-trigger lateral SCR device of FIG. 7A.

FIG. 9 is a layout view of the NTLSCR device of FIG. 7A. As comparing to the prior SCR structure of FIG. 6, there is no P+ diffusion region adjacent to the third N+ diffusion region 108 on the interface of the N well 102 and the P well 103. Thus, the layout spacing of this SCR device of FIG. 7 of the present invention can be more saved to reduce the occupied silicon area in the CMOS IC. Additionally, with a narrower anode-to-cathode layout spacing in the SCR device structure for the present invention, the turn-on speed of SCR device can be further improved to quickly discharge the ESD current.

Figure 10:
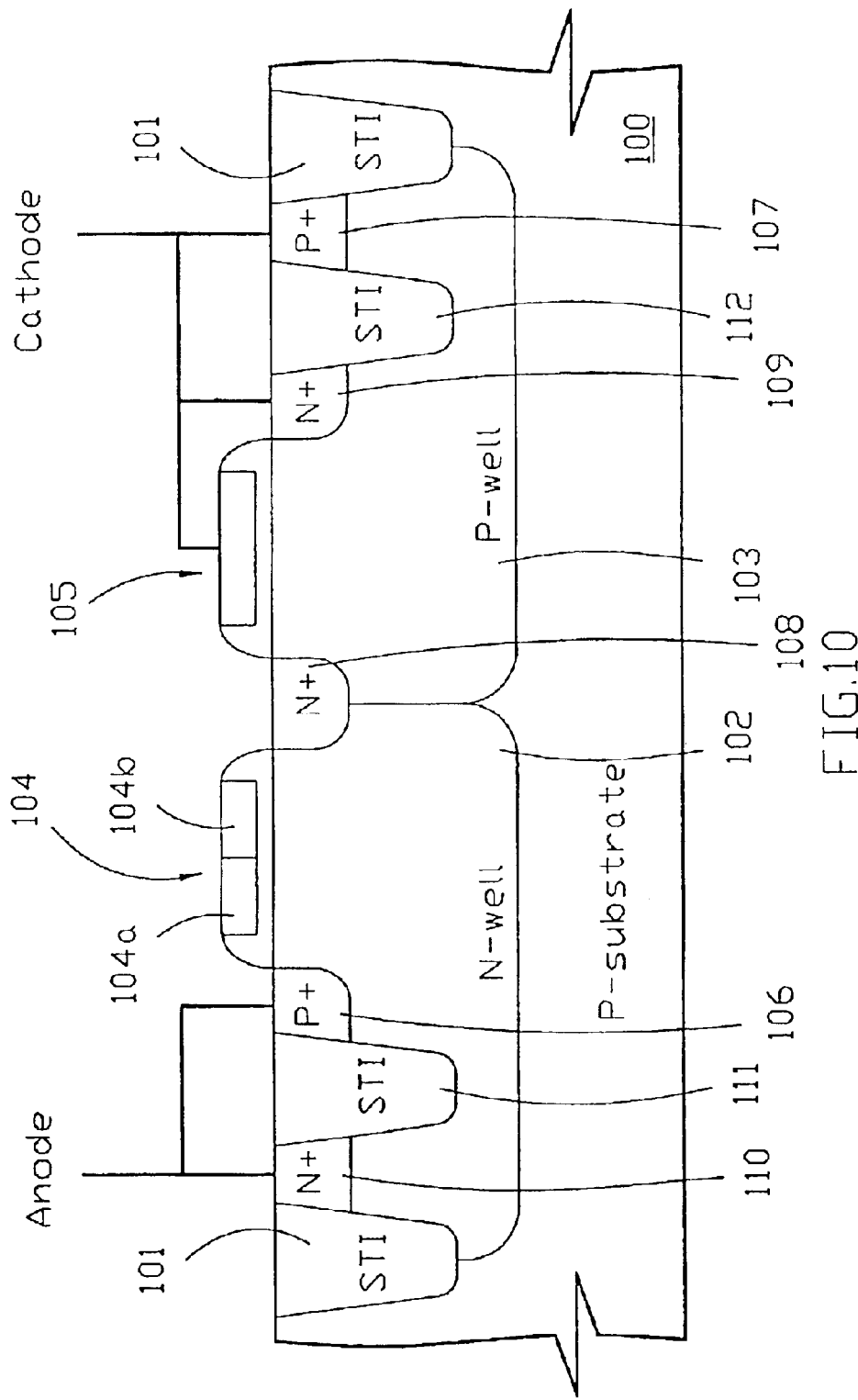
FIG. 10 depicts a cross-sectional view of another alternative of the NMOS-trigger lateral SCR device of FIG. 7A.
Figure 12:
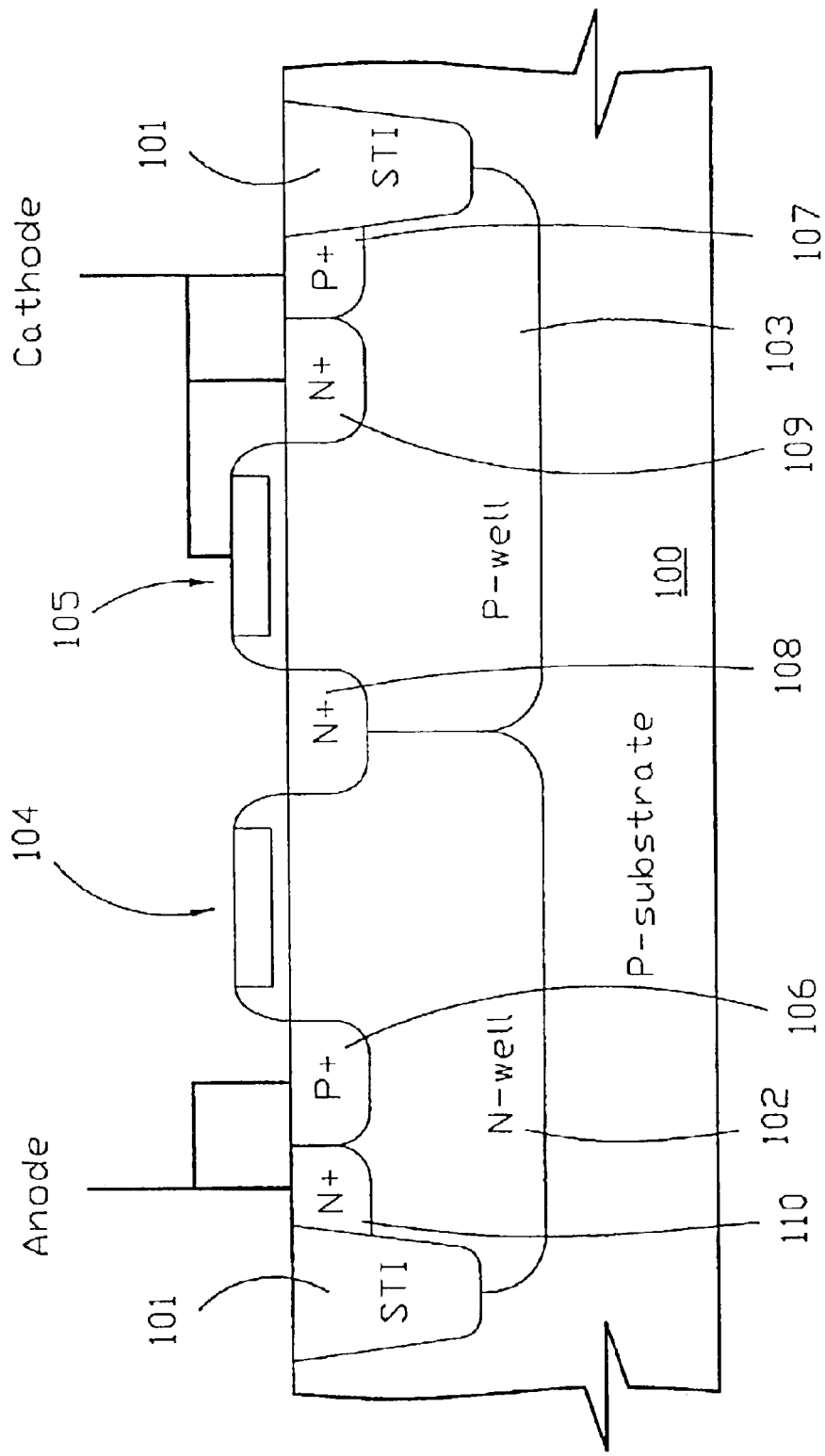
FIG. 12 depicts a cross-sectional view of a further alternative of the NMOS-trigger lateral SCR device of FIG. 7A.

FIG. 10 shows another alternative of the NMOS-trigger LSCR of FIG. 7A, adding a shallow trench isolation 111 between the first P+ diffusion region 106 and the fifth N+ diffusion region 110, and a shallow trench isolation 112 between the second P+ diffusion region 107 and the fourth N+ diffusion region 109. FIG. 12 shows a further alternative of the NMOS-trigger LSCR of FIG. 7A, using a metal gate as the dummy gate 104.

FIG. 8A shows a PMOS-trigger LSCR (PTLSCR) device of the second preferred embodiment according to the present invention. The method of the second preferred embodiment comprises providing a P substrate 200 and forming a plurality of shallow trench isolations 201 in the substrate 200. Next, forming an N well 202 and a P well 203 adjacent thereto between one pair of the shallow trench isolations 201 in the substrate 200. The N well 202 and P well 203 can be formed by way of the known ion implantation using a dosage of dopant about $10^{12}$ to $10^{13}/cm^2$. Thereafter, forming a dummy gate 204 and a P type MOS-like polysilicon gate 205 respectively on the P well 203 and N well 202. The dummy gate 204 comprises a P type gate electrode 204a and an N type gate electrode 204b, both of which can be formed by the known dopant implantation. The P type MOS-like polysilicon gate 205 is connected to an anode terminal. Afterward, simultaneously forming a first highly doped P+ diffusion region 206 beside one side of the P type MOS-like polysilicon gate 205 in the N well 202, a second highly doped P+ diffusion region 207 on the interface of the N well 202 and the P well 203 and between the dummy gate 204 and the P type MOS-like polysilicon gate 205, and a third highly doped P+ diffusion region 208 between the dummy gate 204 and the shallow trench isolation 201 in the P well 203. The first P+ diffusion region 206 is connected to the anode terminal, and the third P+ diffusion region 208 is connected to a cathode terminal. These highly doped P+ diffusion regions 206, 207 and 208 can be formed by way of the known ion implantation using a dosage of dopant about $10^{15}/cm^2$, which is the same as the method for forming a MOS source/drain region. Finally, simultaneously forming a fourth highly doped N+ diffusion region 209 between the dummy gate 204 and third P+ diffusion region 208, and a fifth highly doped N+ diffusion region 210 between the first P+ diffusion region 206 and one shallow trench isolation 201 in the N well 202. The fourth N+ diffusion region 209 is connected to the cathode terminal and the fifth N+ diffusion region 210 is connected to the anode terminal. These highly doped N+ diffusion regions 209 and 210 can be formed by way of the conventional ion implantation using a dosage of dopant about $10^{15}/cm^2$, which is the same as the method for forming a MOS source/drain region. Thereby, the first P+ diffusion region 206, N well 202, P well 203 and fourth N+ diffusion region 209 form the PNPN structure of the PTLSCR device.

Figure 8B:
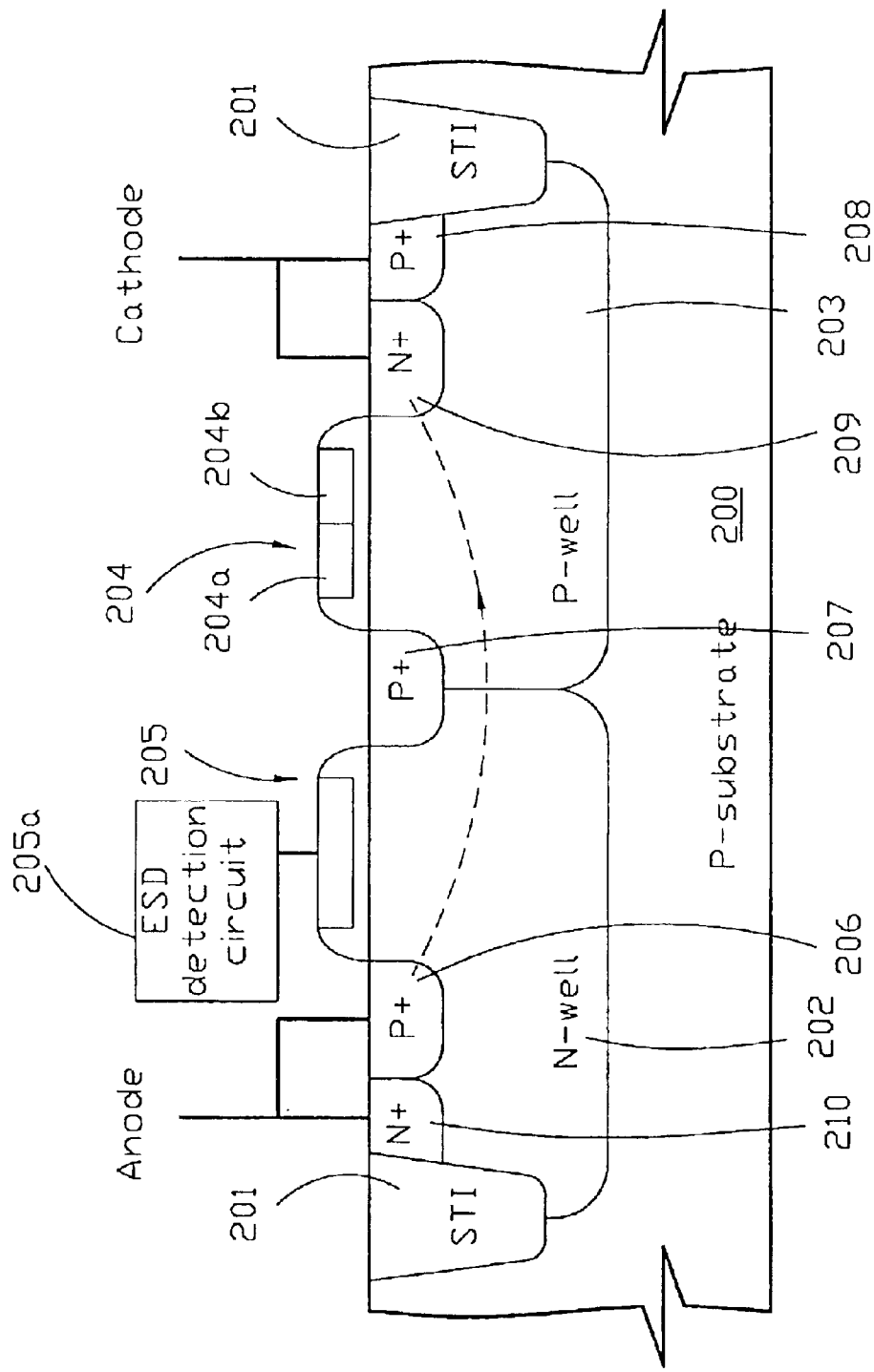
FIG. 8B depicts a cross-sectional view of an alternative of the PMOS-trigger lateral SCR device of FIG. 8A.

FIG. 8B shows an alternative of the PTLSCR device of FIG. 8A, in which the P type MOS-like polysilicon gate 205 is not connected to the anode, but connected to an ESD detection circuit 205a. During ESD zappping, the ESD detection circuit 205a can detect the ESD event and generate a relatively negative bias voltage Vg to turn on the gate 205. Therefore, the PMOS-trigger SCR device can be directly turned on more quickly by the Vg voltage. When the PMOS transistor is turned on by the gate voltage Vg, the SCR will be triggered on.

Figure 11:
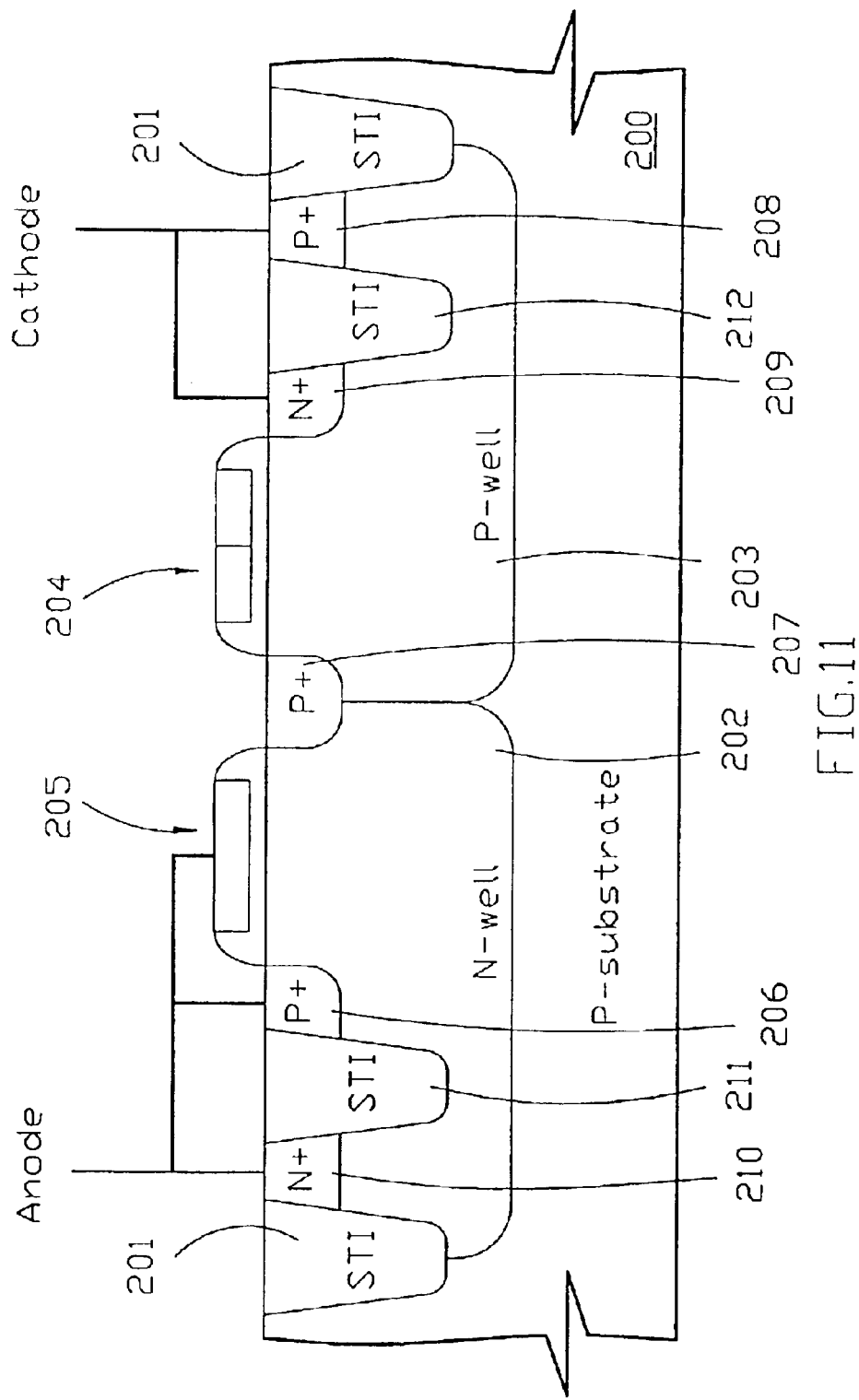
FIG. 11 depicts a cross-sectional view of another alternative of the PMOS-trigger lateral SCR device of FIG. 8A.
Figure 13:
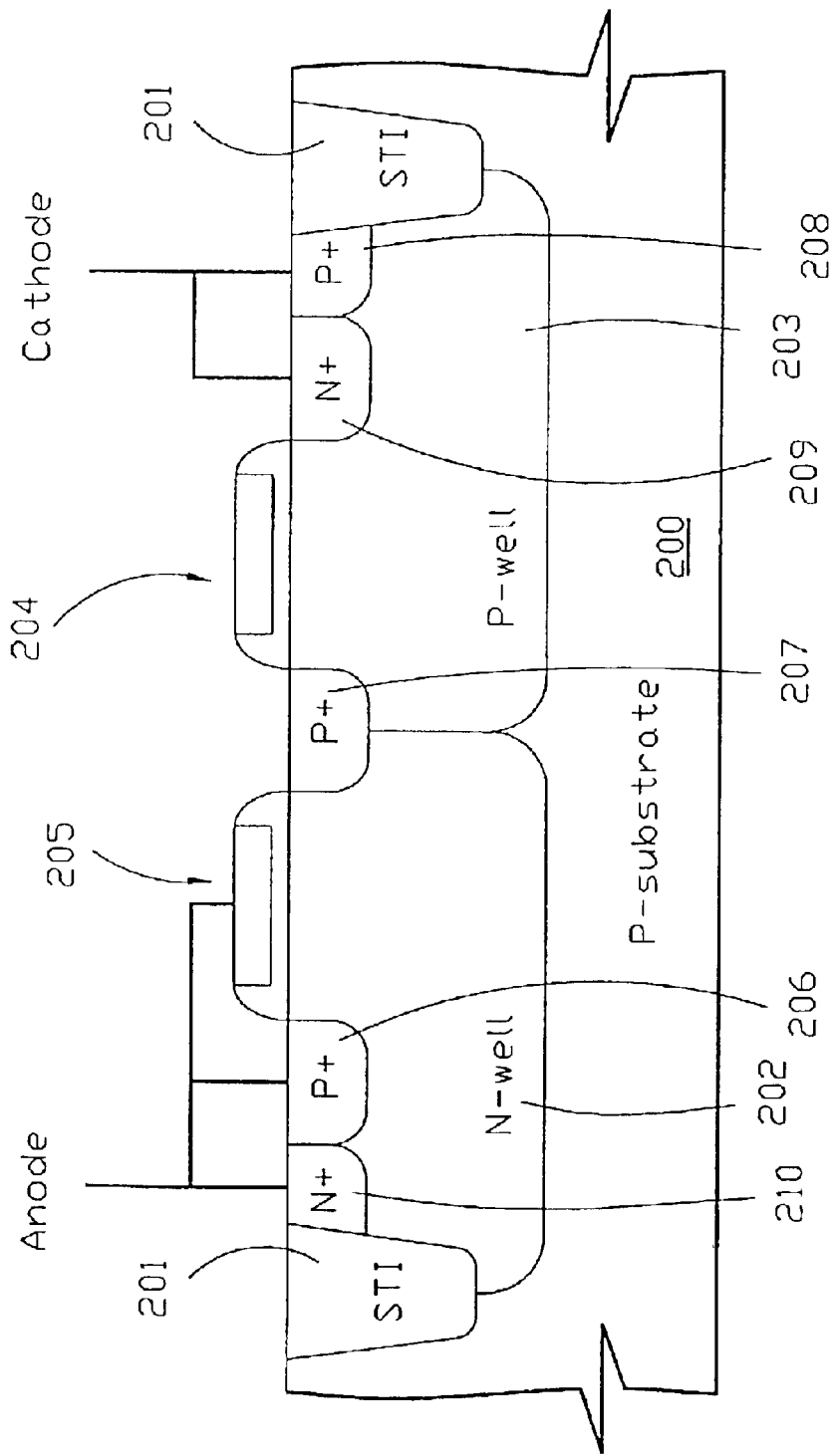
FIG. 13 depicts a cross-sectional view of a further alternative of the PMOS-trigger lateral SCR device of FIG. 8A.

FIG. 11 shows another alternative of the PTLSCR device of FIG. 8A, which adding a shallow trench isolation 211 between the first P+ diffusion region 206 and the fifth N+ diffusion region 210 in the N well 202, and a shallow trench isolation 212 between the third P+ diffusion region 208 and the fourth N+ diffusion region 209 in the P well 203. FIG. 13 shows a further alternative of the PTLSCR device of FIG. 8A, which using a metal gate as the dummy gate 204.

In view of the foregoing, for the present invention, the shallow trench isolation (STI) field oxide region in the conduction current flowing path of the traditional SCR device in sub-quarter-micron CMOS process is removed and instead of a dummy gate. Without the STI region in the present SCR device, the present SCR device provides a narrower anode-to-cathode spacing, therefore, a quicker turn-on speed is obtained to discharge the ESD current, and thus the present SCR device has a better ESD protection capability to protect the CMOS IC against ESD damages in the sub-quarter-micron CMOS processes. The silicon area occupied by the present SCR device is also saved. Furthermore, the present SCR device can be realized by only changing layout pattern in the mask layers, and thus the present invention is fully process-compatible to general CMOS technologies.

The preferred embodiments are only used to illustrate the present invention, not intended to limit the scope thereof. Many modifications of the preferred embodiments can be made without departing from the spirit of the present invention.

What is claimed is:

1. A method for forming a lateral SCR device for on-chip ESD protection in shallow-trench-isolation CMOS process, said method comprising:

providing a semiconductor substrate with a first conductive type;

forming a plurality of shallow trench isolations in said substrate;

forming a first well with a second conductive type between one pair of said shallow trench isolations in said substrate;

forming a dummy gate above said first well on said substrate;

forming a MOS-like gate with said second conductive type on said substrate beside said first well;

forming first highly doped diffusion regions with said second conductive type beside each side of said MOS-like gate in said substrate, one of said first diffusion regions across one portion of said first well and one portion of said substrate and adjacent to one side of said dummy gate, while another one of said first diffusion regions from opposite to said one of said first diffusion regions connected to a cathode terminal; and forming a second highly doped diffusion region with said first conductive type beside said dummy gate, said second highly doped diffusion region formed opposite to said one of said first diffusion regions and adjacent to said dummy gate, said second diffusion region connected to an anode terminal.

2. The method of claim 1, wherein said MOS-like gate is connected to said cathode terminal.

3. The method of claim 1, wherein a third highly doped diffusion region with said second conductive type is formed beside said second diffusion region with said first conductive type adjacent to said dummy gate in said first well.

4. The method of claim 3, wherein said third diffusion region is connected to said anode terminal.

5. The method of claim 1, wherein a fourth highly doped diffusion region with said first conductive type is formed beside said another one of said first diffusion regions with said second conductive type connected to said cathode terminal in said substrate.

6. The method of claim 5, wherein said fourth diffusion region with said first conductive type is connected to said cathode terminal.

7. The method of claim 1, wherein said dummy gate comprises a first polysilicon gate electrode with said first conductive type and a second polysilicon gate electrode with said second conductive type, said first polysilicon gate electrode adjacent to said second diffusion region, while said second polysilicon gate electrode adjacent to said one of said first diffusion regions across one portion of said first well and one portion of said substrate.

8. The method of claim 1, wherein said dummy gate is formed of a metal gate.

9. The method of claim 1, wherein a second well with said first conductive type is formed between said first well and one said shallow trench isolation in said substrate, said MOS-like gate, said another one of said first diffusion regions between said MOS-like gate and said fourth diffusion region, and said fourth diffusion region enclosed by said second well, while said one of said first diffusion regions between said MOS-like gate and said dummy gate across one portion of said first well and one portion of said second well.

10. The method of claim 1, wherein said substrate is formed of a P type silicon substrate.

11. The method of claim 1, wherein said first well is formed of a N well with a dopant concentration about $10^{12}$ to $10^{13}/cm^2$.

12. The method of claim 9, wherein said second well is formed of a P well with a dopant concentration about $10^{12}$ to $10^{13}/cm^2$.

13. The method of claim 1, wherein said first highly doped diffusion region is formed of a $N^+$ diffusion region with a dopant concentration about $10^{15}/cm^2$.

14. The method of claim 1, wherein said second highly doped diffusion region is formed of a $P^+$ diffusion region with a dopant concentration about $10^{15}/cm^2$.

15. The method of claim 3, wherein said third highly doped diffusion region is formed of a $N^+$ diffusion region with a dopant concentration about $10^{15}/cm^2$.

16. The method of claim 5, wherein said fourth highly doped diffusion region is formed of a $P^+$ diffusion region with a dopant concentration about $10^{15}/cm^2$.

17. The method of claim 7, wherein said first polysilicon gate electrode and said second polysilicon gate electrode of said dummy gate are respectively formed of a P type polysilicon gate and a N type polysilicon gate.

18. The method of claim 1, wherein one said shallow trench isolation is formed between said second diffusion region and said third diffusion region in said first well, and one said shallow trench isolation is formed between said another one of said first diffusion regions and said fourth diffusion region in said substrate.

19. A method for forming a lateral SCR device for on-chip ESD protection in shallow-trench-isolation CMOS process, said method comprising:

providing a semiconductor substrate with a first conductive type;

forming a plurality of shallow trench isolations in said substrate;

forming a first well with a second conductive type between one pair of said shallow trench isolations in said substrate;

forming a MOS-like gate with said first conductive type on said first well;

forming a dummy gate on said substrate beside said first well;

forming first highly doped diffusion regions with said first conductive type beside each side of said MOS-like gate in said first well, one of said first diffusion region across one portion of said first well and one portion of said substrate and adjacent to one side of said dummy gate, while another one of said first diffusion regions from opposite to said one of said first diffusion regions connected to an anode terminal; and forming a second highly doped diffusion region with said second conductive type beside said dummy gate, said second highly doped diffusion region formed opposite to said one of said first diffusion regions and adjacent to said dummy gate, said second diffusion region connected to a cathode terminal.

20. The method of claim 19, wherein said MOS-like gate is connected to said anode terminal.

21. The method of claim 19, wherein a third highly doped diffusion region with said second conductive type is formed beside said another one of said first diffusion regions with said first conductive type adjacent to said dummy gate in said first well.

22. The method of claim 19, wherein said third diffusion region is connected to said anode terminal.

23. The method of claim 19, wherein a fourth highly doped diffusion region with said first conductive type is formed beside said second diffusion region with said second conductive type connected to said cathode terminal in said substrate.

24. The method of claim 23, wherein said fourth diffusion region with said first conductive type is connected to said cathode terminal.

25. The method of claim 19, wherein said dummy gate comprises a first polysilicon gate electrode with said first conductive type and a second polysilicon gate electrode with said second conductive type, said first polysilicon gate electrode adjacent to another one of said first diffusion regions across one portion of said first well and one portion of said said substrate, while said second polysilicon gate electrode adjacent to said second diffusion region connected to said cathode terminal.

26. The method of claim 19, wherein said dummy gate is formed of a metal gate.

27. The method of claim 19, wherein a second well with said first conductive type is formed between said first well and one said shallow trench isolation in said substrate, said dummy gate, said second diffusion region between said dummy gate and said fourth diffusion region, and said fourth diffusion region enclosed by said second well, while said another one of said first diffusion regions between said MOS-like gate and said dummy gate across one portion of said first well and one portion of said second well.

28. The method of claim 19, wherein said substrate is formed of a P type silicon substrate.

29. The method of claim 19, wherein said first well is formed of a N well with a dopant concentration about $10^{12}$ to $10^{13}/cm^2$.

30. The method of claim 19, wherein said second well is formed of a P well with a dopant concentration about $10^{12}$ to $10^{13}/cm^2$.

31. The method of claim 19, wherein said first highly doped diffusion region is formed of a $P^+$ diffusion region with a dopant concentration about $10^{15}/cm^2$.

32. The method of claim 19, wherein said second highly doped diffusion region is formed of a N⁺ diffusion region with a dopant concentration about $10^{15}/cm^2$.

33. The method of claim 21, wherein said third highly doped diffusion region is formed of a N⁺ diffusion region with a dopant concentration about $10^{15}/cm^2$.

34. The method of claim 23, wherein said fourth highly doped diffusion region is formed of a P⁺ diffusion region with a dopant concentration about $10^{15}/cm^2$.

35. The method of claim 25, wherein said first polysilicon gate and said second polysilicon gate of said dummy gate are respectively formed of a P type polysilicon gate, and a N type polysilicon gate.

36. The method of 19, claim wherein one said shallow trench isolation is formed between said one of said first diffusion regions and said third diffusion region in said first well, and one said shallow trench isolation is formed between said second diffusion region and said fourth diffusion region in said substrate.

* * * * *